(12) United States Patent
Apodaca et al.

(10) Patent No.: US 10,217,505 B1
(45) Date of Patent: Feb. 26, 2019

(54) CHIP WITH PHASE CHANGE MEMORY AND MAGNETORESISTIVE RANDOM ACCESS MEMORY

(71) Applicant: SanDisk Technologies LLC, Plano, TX (US)

(72) Inventors: Mac D. Apodaca, San Jose, CA (US); Luiz Franca-Neto, Sunnyvale, CA (US); Jordan Katine, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/692,780

(22) Filed: Aug. 31, 2017

(51) Int. Cl.
*G11C 11/16* (2006.01)
*G11C 11/4096* (2006.01)
*G11C 11/56* (2006.01)
*G11C 13/00* (2006.01)
*H03K 19/16* (2006.01)
*H01L 45/00* (2006.01)

(52) U.S. Cl.
CPC ...... *G11C 11/4096* (2013.01); *G11C 11/5678* (2013.01); *G11C 13/0004* (2013.01); *H01L 45/06* (2013.01); *H03K 19/16* (2013.01)

(58) Field of Classification Search
CPC .............................. G11C 11/16; G11C 13/0004
USPC .......................................................... 365/158
See application file for complete search history.

(56) References Cited

U.S. PATENT DOCUMENTS

| | | | |
|---|---|---|---|
| 5,991,851 A | 11/1999 | Alwais et al. | |
| 7,759,715 B2 | 7/2010 | Bhattacharyya | |
| 2010/0191898 A1 | 6/2010 | Kim et al. | |
| 2014/0063924 A1* | 3/2014 | Nakai | G11C 11/16 365/158 |
| 2014/0256100 A1 | 9/2014 | Lam et al. | |

* cited by examiner

*Primary Examiner* — Jason Lappas
(74) *Attorney, Agent, or Firm* — Kunzler, PC (57) ABSTRACT

Apparatuses, systems, and methods are disclosed for a chip with phase change memory (PCM) and magnetoresistive random access memory (MRAM). An apparatus includes a semiconductor circuit formed over a substrate of a chip. An apparatus includes a PCM array formed over a semiconductor circuit. An apparatus includes an MRAM array formed over a semiconductor circuit.

20 Claims, 6 Drawing Sheets

CHIP WITH PHASE CHANGE MEMORY AND MAGNETORESISTIVE RANDOM ACCESS MEMORY

TECHNICAL FIELD

The present disclosure, in various embodiments, relates to magnetoresistive random access memory and more particularly relates to a chip with phase change memory and magnetoresistive random access memory.

BACKGROUND

Various types of magnetoresistive random access memory (MRAM) store data using magnetic tunnel junctions. A magnetic tunnel junction (MTJ) may include "fixed" and "free" magnetic layers, where a magnetic moment of the free layer may be switched to be parallel or antiparallel to a magnetic moment of the fixed layer. A thin dielectric or barrier layer may separate the fixed and free layers, and current may flow across the barrier layer due to quantum tunneling. A difference in resistance between parallel and antiparallel states allows data to be stored. For example, a low resistance may correspond to a binary "1" and a high resistance may correspond to a binary "0." Alternatively, a low resistance may correspond to a binary "0" and a high resistance may correspond to a binary "1."

Certain types of phase change memory (PCM) store data based on a phase of a material, such as chalcogenide. For example, an amorphous, high resistance state may represent a binary "0" and a crystalline, low resistance state may represent a binary "1." Alternatively, an amorphous, high resistance state may represent a binary "1" and a crystalline, low resistance state may represent a binary "0." There are certain conditions in which MRAM may be best to be used and some conditions in which PCM may be best to be used.

SUMMARY

Apparatuses are presented for a chip with phase change memory (PCM) and magnetoresistive random access memory (MRAM). In one embodiment, an apparatus includes a semiconductor logic circuit formed over a substrate of a chip. In a certain embodiment, an apparatus includes a PCM array formed over a semiconductor logic circuit. In a further embodiment, an apparatus includes an MRAM array formed over a semiconductor logic circuit.

Methods are presented for a chip with PCM and MRAM. In one embodiment, a method includes forming a complementary metal oxide semiconductor (CMOS) layer on a substrate. In various embodiments, a CMOS layer includes multiple CMOS circuits. In a certain embodiment, a method includes forming a PCM layer above a CMOS layer. In some embodiments, a PCM layer includes multiple PCM elements. In one embodiment, a first set of CMOS circuits of multiple CMOS circuits is electrically coupled to multiple PCM elements. In a further embodiment, a method includes forming an MRAM layer above a PCM layer. In a certain embodiment, an MRAM layer includes multiple MRAM elements, and a second set of CMOS circuits of multiple CMOS circuits is electrically coupled to the multiple MRAM elements.

An apparatus, in another embodiment, includes means for controlling operation of a memory device, the means for controlling operation formed on a substrate of the memory device. In a certain embodiment, an apparatus includes means for storing data using a magnetoresistive property within a memory device. In a further embodiment, an apparatus includes means for storing data using an electrical resistive property within a memory device, the means for storing data using the electrical resistive property disposed in a layer between a means for storing data using a magnetoresistive property and a means for controlling operation of a memory device formed on a substrate.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Figure 1:
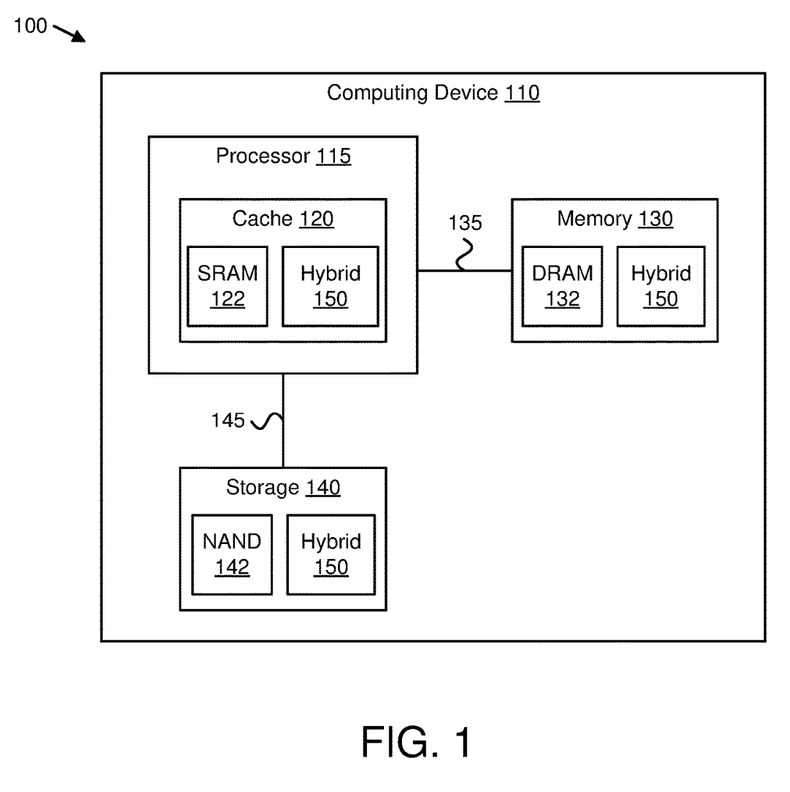
FIG. 1 is a schematic block diagram of one embodiment of a system comprising a hybrid die.

FIG. 1 depicts a system 100 comprising a hybrid die 150. In certain embodiments, the hybrid die 150 may include phase change memory (PCM) and magnetoresistive random access memory (MRAM). In the depicted embodiment, the system includes a computing device 110. In various embodiments, a computing device 110 may refer to any electronic device capable computing by performing arithmetic or logical operations on electronic data. For example, a computing device 110 may be a server, a workstation, a desktop computer, a laptop computer, a tablet, a smartphone, a control system for another electronic device, a network attached storage device, a block device on a storage area network, a router, a network switch, or the like. In certain embodiments, a computing device 110 may include a non-transitory, computer readable storage medium that stores computer readable instructions configured to cause the computing device 110 to perform steps of one or more of the methods disclosed herein.

In the depicted embodiment, the computing device 110 includes a processor 115, a memory 130, and storage 140. In various embodiments, a processor 115 may refer to any electronic element that carries out the arithmetic or logical operations performed by the computing device. For example, in one embodiment, the processor 115 may be a general-purpose processor that executes stored program code. In another embodiment, a processor 115 may be a field-programmable gate array (FPGA), an application-specific integrated circuit (ASIC), or the like, that operates on data stored by the memory 130 and/or the storage 140. In a certain embodiment, a processor 115 may be a controller for a storage device (e.g., on a storage area network) a networking device, or the like.

In the depicted embodiment, the processor 115 includes a cache 120. In various embodiments, a cache 120 may store data for use by the processor 115. In certain embodiments, a cache 120 may be smaller and faster than the memory 130, and may duplicate data in frequently-used locations of the memory 130, or the like. In certain embodiments, a processor 115 may include a plurality of caches 120. In various embodiments, a cache 120 may include one or more types of memory media for storing data, such as static random access memory (SRAM) 122, the hybrid die 150, or the like. For example, in one embodiment, a cache 120 may include SRAM 122. In another embodiment, a cache 120 may include the hybrid die 150. In a certain embodiment, a cache 120 may include a combination of SRAM 122, the hybrid die 150, and/or other memory media types.

The memory 130, in one embodiment, is coupled to the processor 115 by a memory bus 135. In certain embodiments, the memory 130 may store data that is directly addressable by the processor 115. In various embodiments, a memory 130 may include one or more types of memory media for storing data, such as dynamic random access memory (DRAM) 132, the hybrid die 150, or the like. For example, in one embodiment, a memory 130 may include DRAM 132. In another embodiment, a memory 130 may include the hybrid die 150. In a certain embodiment, a memory 130 may include a combination of DRAM 132, the hybrid die 150, and/or other memory media types.

The storage 140, in one embodiment, is coupled to the processor 115 by a storage bus 145. In certain embodiments, the storage bus 145 may be a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 140 may store data that is not directly addressable by the processor 115, but that may be accessed via one or more storage controllers. In certain embodiments, the storage 140 may be larger than the memory 130. In various embodiments, a storage 140 may include one or more types of storage media for storing data, such as a hard disk drive, NAND flash memory 142, the hybrid die 150, or the like. For example, in one embodiment, a storage 140 may include NAND flash memory 142. In another embodiment, a storage 140 may include the hybrid die 150. In a certain embodiment, a storage 140 may include a combination of NAND flash memory 142, the hybrid die 150, and/or other storage media types.

In various embodiments, the hybrid die 150 may be used to store data in a cache 120, memory 130, storage 140, and/or another component that stores data. For example, in the depicted embodiment, the computing device 110 includes the hybrid die 150 in the cache 120, memory 130, and storage 140. In another embodiment, a computing device 110 may use MRAM 150 for memory 130, and may use other types of memory or storage media for cache 120 or storage 140. Conversely, in another embodiment, a computing device 110 may use the hybrid die 150 for storage 140, and may use other types of memory media for cache 120 and memory 130. Additionally, some types of computing device 110 may include memory 130 without storage 140 (e.g., in a microcontroller) if the memory 130 is non-volatile, may include memory 130 without a cache 120 for specialized processors 115, or the like. Various combinations of cache 120, memory 130, and/or storage 140, and uses of the hybrid die 150 for cache 120, memory 130, storage 140, and/or other applications will be clear in view of this disclosure.

In various embodiments, the hybrid die 150 may be one chip, packages, die, or other integrated circuit devices comprising PCM and MRAM disposed on one printed circuit board, storage housing, and/or other mechanical and/or electrical support structure. In some embodiments, the cache 120, the memory 130, and/or the storage 140 may include one or more hybrid die 150. For example, one or more dual inline memory modules (DIMMs), one or more expansion cards and/or daughter cards, a solid-state-drive (SSD) or other storage device, and/or another memory and/or storage form factor may comprise one or more hybrid die 150. The hybrid die 150 may be integrated with and/or mounted on a motherboard of the computing device 110, installed in a port and/or slot of the computing device 110, installed on a different computing device 110 and/or a dedicated storage appliance on a network, in communication with a computing device 110 over an external bus, or the like.

The hybrid die 150, in various embodiments, may include a semiconductor logic circuit (e.g., a complementary metal oxide semiconductor (CMOS) circuit, an n-type metal oxide semiconductor (NMOS) circuit, or the like) formed over a substrate of a chip. In certain embodiments, the hybrid die 150 may include a PCM array formed over a semiconductor logic circuit (e.g., CMOS, NMOS, or the like). In certain embodiments, the hybrid die 150 may include an MRAM array formed over a semiconductor logic circuit (e.g., CMOS, NMOS, or the like). The hybrid die 150 is described in further detail below with regard to FIGS. 2 through 8.

Figure 2:
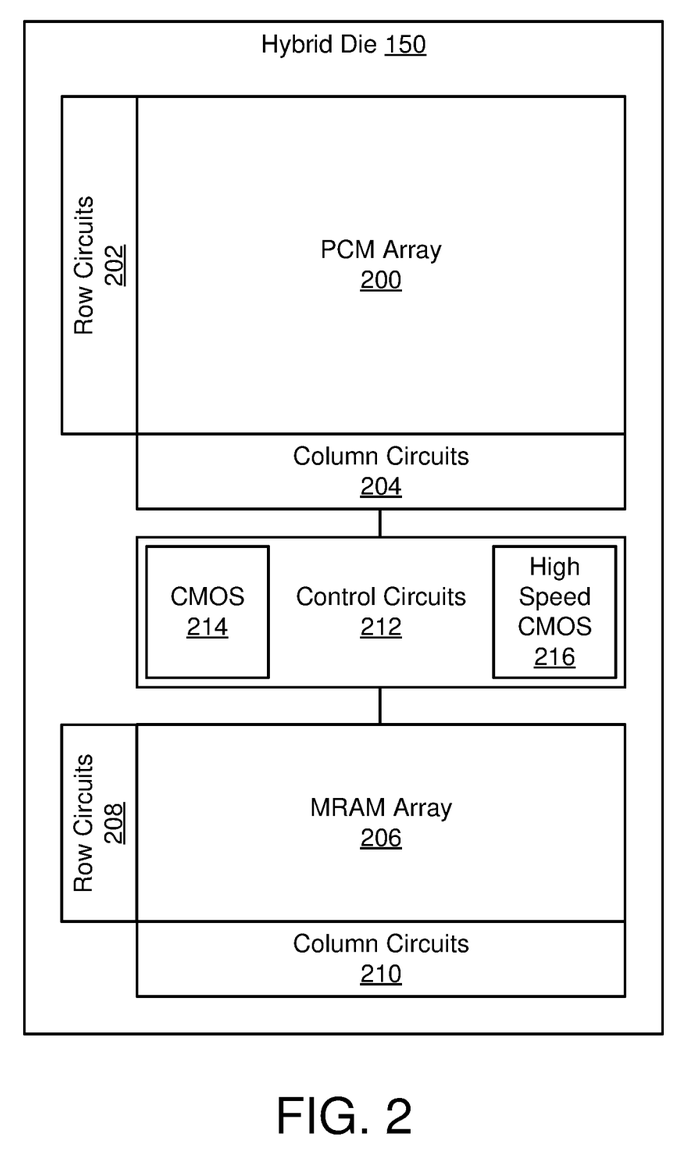
FIG. 2 is a schematic block diagram illustrating one embodiment of a hybrid die.

FIG. 2 depicts one embodiment of a hybrid die 150. The hybrid die 150 may be substantially similar to the hybrid 150 described with reference to FIG. 1. The hybrid die 150, in the depicted embodiment, includes a PCM array 200 of PCM elements having corresponding row circuits 202 and column circuits 204. Moreover, the hybrid die 150 includes an MRAM array 206 having corresponding row circuits 208 and column circuits 210. Furthermore, the hybrid die 150 includes control circuits 212 which may have CMOS 214 (e.g., standard speed CMOS) and high speed CMOS 216. While CMOS is primarily described herein as one example embodiment of semiconductor logic, as described above, in other embodiments, semiconductor logic may comprise NMOS circuits (e.g., n-type field effect transistors) to implement logic gates or other digital circuits, instead of or in addition to CMOS circuits (e.g., a combination of p-type and n-type field-effect transistors).

In various embodiments, a hybrid die 150 may refer to an integrated circuit that includes a PCM array 200 of PCM cells for phase change data storage, peripheral components (e.g., row circuits 202 and/or column circuits 204) for communicating with the PCM array 200, an MRAM array 206 of MRAM cells for magnetoresistive data storage, peripheral components (e.g., row circuits 208 and/or column circuits 210) for communicating with the MRAM array 206, and/or control circuits 212 (e.g., CMOS 214 and/or high speed CMOS 216). In certain embodiments, one or more hybrid die 150 may be included in a memory module, a storage device, or the like.

In the depicted embodiment, the PCM array 200 includes a plurality of phase change elements for storing data. In one embodiment, the PCM array 200 may be a two-dimensional array. In another embodiment, the PCM array 200 may be a three-dimensional array that includes multiple planes and/or layers of phase change elements. In various embodiments, the PCM array 200 may be addressable by rows (e.g., word lines) via row circuits 202, and by columns (e.g., bit lines) via column circuits 204.

In the depicted embodiment, the MRAM array 206 includes a plurality of magnetic tunnel junctions for storing data. In one embodiment, the MRAM array 206 may be a two-dimensional array. In another embodiment, the MRAM array 206 may be a three-dimensional array that includes multiple planes and/or layers of MTJs. In various embodiments, the MRAM array 206 may be addressable by rows (e.g., word lines) via row circuits 208, and by columns (e.g., bit lines) via column circuits 210.

The control circuits 212, in certain embodiments, cooperates with the row circuits 202 and 208, and the column circuits 204 and 210 to perform memory operations on the PCM array 200 and the MRAM array 206. In various embodiments, the control circuits 212 may include components such as a power control circuit that controls the power and voltages supplied to the row circuits 202 and 208, and column circuits 204 and 210 during memory operations, an address decoder that translates a received address to a hardware address used by the row circuits 202 and 208 and column circuits 204 and 210, a state machine that implements and controls the memory operations, and the like. The control circuits 212 may communicate with a computing device 110, a processor 115, a bus controller, a storage device controller, a memory module controller, or the like to receive command and address information, transfer data, or the like.

Figure 3:
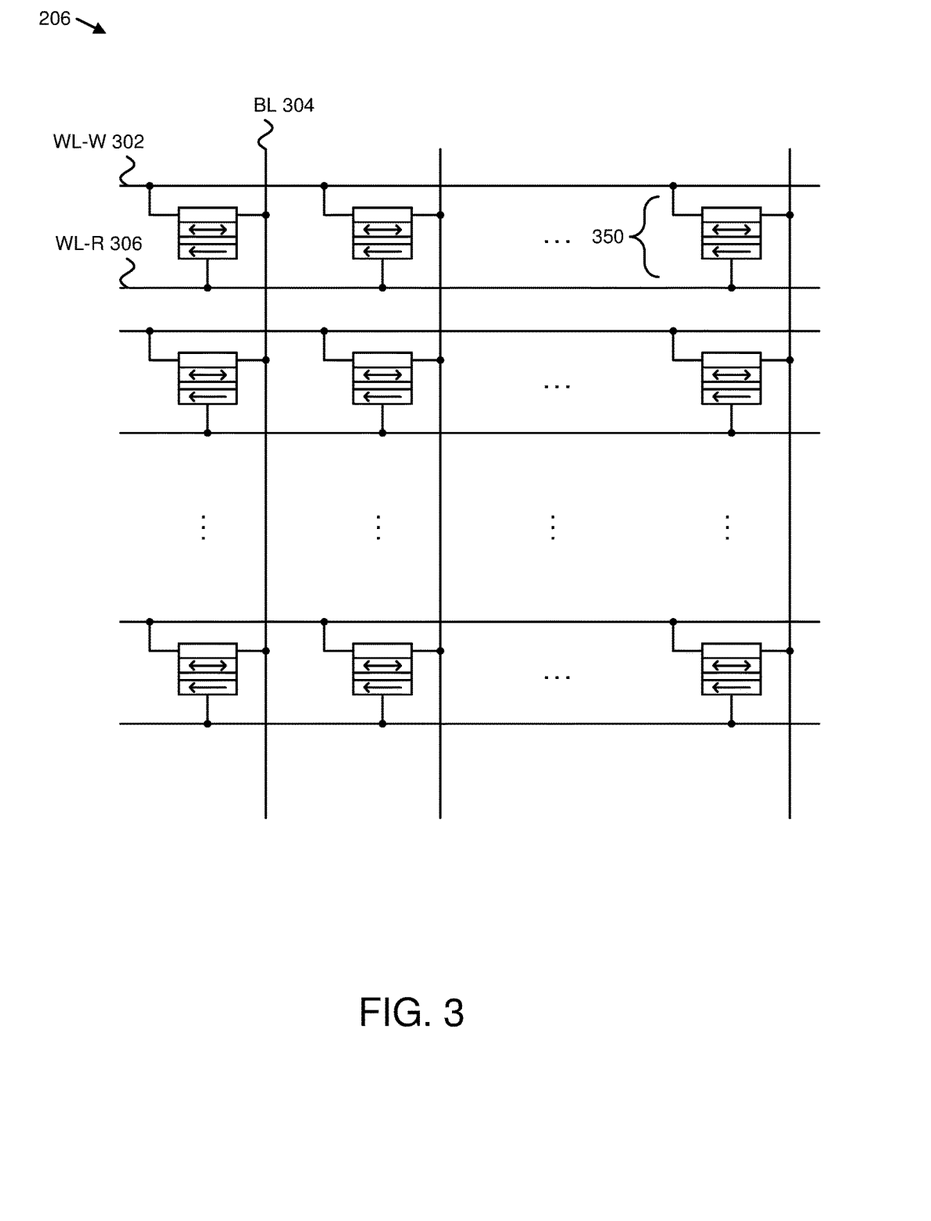
FIG. 3 is a schematic diagram illustrating one embodiment of a magnetic tunnel junction array.

FIG. 3 depicts one embodiment of an MRAM array 206. The MRAM array 206 may be substantially similar to the MRAM array 206 described with reference to FIG. 2. In the depicted embodiment, the MRAM array 206 includes a plurality of MTJs 350 for storing data, coupled to write word lines (WL-W) 302, read word lines (WL-R) 306, and bit lines 304.

An MTJ 350, in the depicted embodiment, includes a fixed or reference layer with a fixed or pinned magnetic moment, indicated by a single-headed arrow. In a further embodiment, an MTJ 350 includes a free layer, with a magnetic moment that can be changed or switched, indicated by a double-headed arrow. A thin dielectric or barrier layer may separate the fixed and free layers, and current may flow across the barrier layer due to quantum tunneling. The probability of an electron tunneling through the barrier layer is higher if the magnetic moments of the fixed and free layers are substantially parallel to each other (referred to herein as the parallel state for the MTJ 350), and lower if the magnetic moments of the fixed and free layers are substantially antiparallel to each other (referred to herein as the antiparallel state for the MTJ 350). Therefore, an electrical resistance through the MTJ 350 may be higher in the antiparallel state than in the parallel state.

In various embodiments, a difference in resistance between parallel and antiparallel states of an MTJ 350 allows data to be stored. For example, a low resistance may correspond to a binary "1" and a high resistance may correspond to a binary "0," Alternatively, a low resistance may correspond to a binary "0" and a high resistance may correspond to a binary "1." The difference between the higher antiparallel resistance and the lower parallel resistance, expressed as a percentage of the lower parallel resistance, may be referred to herein as the tunnel magnetoresistance (TMR), or TMR ratio, for the MTJ 350. Thus, for example, a TMR of 100% would indicate that the antiparallel resistance is double (e.g., 100% greater than) the parallel resistance.

In certain embodiments, a TMR ratio for an MTJ 350 may be related to the difficulty of reading data from the MTJ 350. For example, if the ratio between the antiparallel resistance and the parallel resistance of an MTJ 350 is higher, then a lower read voltage may be sufficient to produce detectably different read currents in the antiparallel and parallel states. Conversely, if the ratio between antiparallel resistance and the parallel resistance of an MTJ 350 is lower, then read currents in the antiparallel and parallel states may not be detectably different unless a higher read voltage is applied. Thus, increasing the TMR of an MTJ 350 (or avoiding factors that may decrease TMR) may facilitate read operations for the MTJ 350.

In one embodiment, data may be written to a row of MTJs 350 simultaneously. For example, the write word line 302 for a row may be grounded, and positive or negative program voltages may be applied to the bit lines 304 to write different data values to the MTJs 350 in the row. Various ways of writing data to individual or multiple MTJs 350, in MRAM arrays 206 using various geometries may be used.

Reading data from an MTJ 350, in various embodiments, may include measuring, detecting, or sensing a resistance of the MTJ 350 (e.g., indicating whether the MTJ 350 is in a parallel or antiparallel state). For example, in one embodiment, a known voltage may be applied across the free layer, the barrier layer, and the fixed layer, and the resulting current may be measured or sensed to detect the resistance. In another embodiment, a known current may be applied through the free layer, the barrier layer, and the fixed layer, and the resulting voltage drop across the MTJ 350 may be measured or sensed to detect the resistance. In certain embodiments, an MRAM array 206 or the hybrid die 150 may include sense amplifiers, latches, and the like, to convert a low power signal from a bit line 304 to a logic level representing a 1 or 0, and store the converted data.

In the depicted embodiment, the read word lines 306 and the bit lines 304 are coupled to the MTJs 350 to apply a current through the free layer, the barrier layer, and the fixed layer. For example, reading data from an MTJ 350 at the intersection of a selected read word line 306 and a selected bit line 304 may include applying a read voltage to the selected read word line 306, and a zero (or other reference) voltage to the selected bit line 304, so that the resistance through the MTJ 350 may be sensed. As described above for write operations, selectors, transistors, or the like may prevent stray currents through non-selected MTJs 350 during read operations. Additionally, data may be read from a row of MTJs 350 simultaneously. For example, a read voltage may be applied to a read word line 306 for a row, and the bit lines 304 may be grounded, so that the resulting currents are sensed for multiple bit lines 304. Various ways of reading data from individual or multiple MTJs 350, in MRAM arrays 206 may use various geometries.

Figure 4:
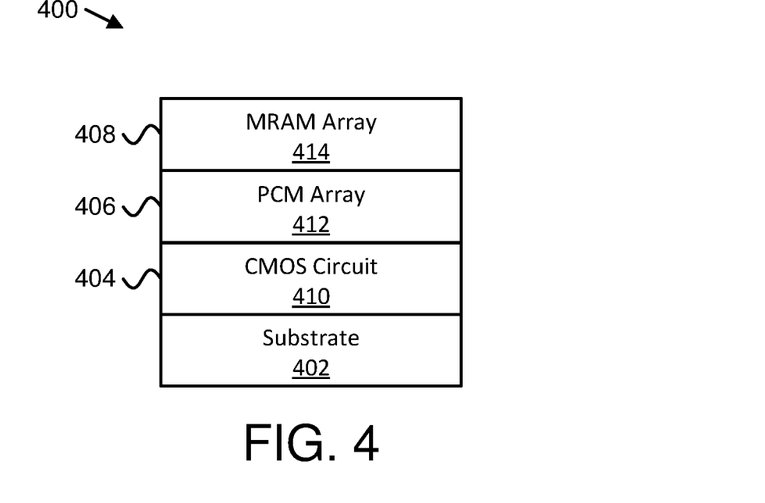
FIG. 4 is a schematic block diagram illustrating one embodiment of a chip having phase change memory (PCM) and magnetoresistive random access memory (MRAM)

FIG. 4 is a schematic block diagram illustrating one embodiment of a chip 400 having PCM and MRAM, such as the hybrid die 150 of FIG. 2. The chip 400 includes a substrate 402, a CMOS layer 404 formed over the substrate 402, a PCM layer 406 formed over the CMOS layer 404, and an MRAM layer 408 formed over the PCM layer 406. As used herein, the terms over and above may mean substantially the same thing. Furthermore, the term over may mean at a different layer in a vertical direction and/or not in a same horizontal layer. Moreover, the term directly over may mean on top of, above in a direct vertical line, and/or vertically adjacent.

The substrate 402 may be any suitable material. In some embodiments, the substrate 402 comprises silicon, silicon dioxide, aluminum oxide, sapphire, germanium, gallium arsenide, an alloy of silicon and germanium, and/or indium phosphide. In various embodiments, the substrate 402 comprises an electrical insulator, such as silicon oxide and/or aluminum oxide. In certain embodiments, the substrate 402 comprises a layer of semiconductor material (e.g., pure silicon) disposed directly over (e.g., on top of) an electrical insulator.

In some embodiments, the CMOS layer 404 may be formed directly over the substrate 402. The CMOS layer 404 may include multiple CMOS circuits 410. In various embodiments, the CMOS circuits 410 of the CMOS layer 404 may be used to control reading, writing, and/or erasing operations performed in the PCM layer 406 and/or the MRAM layer 408. In one embodiment, the CMOS circuits 410 of the CMOS layer 404 may control any suitable operation of the PCM layer 406 and/or the MRAM layer 408. In certain embodiments, the CMOS circuits 410 may include standard CMOS, such as the CMOS 214, and/or high speed CMOS, such as the high speed CMOS 216. The CMOS layer 404 may include any suitable type of CMOS circuits 410. For example, the CMOS circuits 410 may include transistors, field-effect transistors (FETs), metal-oxide-semiconductor field-effect transistors (MOSFETs), inverters, and/or logic gates (e.g., AND, NAND, OR, NOR, etc.). As may be appreciated, the CMOS layer 404 may be formed in any suitable manner, such as by using one or more layers of deposition and/or one or more masks.

In various embodiments, the PCM layer 406 may be formed directly over the CMOS layer 404. In the illustrated embodiment, the PCM layer 406 is formed before (e.g., prior to forming) the MRAM layer 408. In certain embodiments, the PCM layer 406 may be formed before the MRAM layer 408 at least in part because the PCM layer 406 is formed at a higher temperature than the MRAM layer 408. The PCM layer 406 may include a PCM array 412 that may be similar to the PCM array 200. Moreover, the PCM array 412 may include multiple PCM elements used to store data. The PCM elements of the PCM array 412 may be electrically coupled to the CMOS circuits 410 to enable the CMOS circuits 410 to control the PCM array 412. In some embodiments, the PCM elements may use an electrical resistive property for storing data. As may be appreciated, the PCM layer 406 may be formed in any suitable manner, such as by using one or more layers of deposition and/or one or more masks.

In certain embodiments, the MRAM layer 408 may be formed directly over the PCM layer 406. In the illustrated embodiment, the MRAM layer 408 is formed at a different vertical distance from the substrate 402 than the PCM layer 406. In various embodiments, the MRAM layer 408 may be formed by the same equipment used to form the PCM layer 406. The MRAM layer 408 may include an MRAM array 414 that may be similar to the MRAM array 206. Moreover, the MRAM array 414 may include multiple MRAM elements used to store data. The MRAM elements of the MRAM array 414 may be electrically coupled to the CMOS circuits 410 to enable the CMOS circuits 410 to control the MRAM array 414. In some embodiments, the MRAM elements may use a magnetoresistive property for storing data. In certain embodiments, the MRAM array 414 may operate at a higher speed than the PCM array 412. In such embodiments, the MRAM array 414 may buffer data that the PCM array 412 stores. For example, the MRAM array 414 may operate as a read buffer and/or a write buffer for the PCM array 412.

In one embodiment, the MRAM array 414 may store error tracking data associated with data stored in the PCM array 412. In various embodiments, the error tracking data may be stored in error tracking tables. In some embodiments, the error tracking tables may include error correcting codes (ECC). In certain embodiments, the MRAM array 414 may store error correcting and/or tracking data used to correct errors in data stored in the PCM array 412 (e.g., because the MRAM array 414 may have a lower capacity than the PCM array 412, a higher speed than the PCM array 412, a lower error rate than the PCM array 412, or the like). For example, error correcting data may be used with a single-error correction double error detection (SECDED) ECC or the like (e.g., to correct progressive damage accumulated during write operations, or the like) and/or error-tracking tables may be used instead of or in addition to the ECC (e.g., to correct hard errors generated by device variation at fabrication time). Error-tracking tables, in one embodiment, may have lower storage overhead than using ECC of similar strength (e.g., error-tracking tables with a 3% overhead, for example, may be stored in the MRAM array 414 for correcting data in the PCM array 412 as long as the MRAM array 414 is at least 3% as big as the PCM array 412, while a similar ECC may have a storage overhead of 30%, 40%, 100%, or more). An error-tracking table may also have a lower latency than one or more other ECC systems.

In certain embodiments, one or more Bloom Filters or other filters may be used, to avoid unnecessary retrieval of the error-tracking tables from the MRAM array 414. For example, every twelve lines from the error-tracking tables may be hashed into a Bloom Filter, or the like (e.g., a set of Bloom Filters for an error-tracking table may take ⅙ the space of the full error-tracking table). The Bloom Filters and/or error-tracking tables or other error tracking/correcting data may be read from the MRAM array 414 in parallel with the associated data in the PCM array 412, so that little or no additional latency is added to the read operation. In certain embodiments, the error-tracking tables stored in the MRAM array 414 identify locations of "limited-range programmable cells" and/or other error-prone or damaged cells in the PCM array 412 (e.g., PCM cells that cannot be programmed beyond one or more read threshold levels, as opposed to "full-range programmable cells"). In one embodiment, the error-tracking tables stored in the MRAM array 414 identify both the locations of "limited-range programmable cells" and/or other error-prone or damaged cells in the PCM array 412 and the correct and/or proper data values stored in the identified cells.

In a further embodiment, an ECC system (e.g., separate from and/or used in coordination with the error-tracking tables) may be used to correct data errors in "full-range programmable cells" of the PCM array 412 (e.g., ECC data may be stored in the MRAM array 414 for the PCM array 412, in the PCM array 412, or both). In one embodiment, "full-range programmable cells" may be capable of being programmed to higher magnitude voltages and/or resistances than "limited-range programmable cells" (e.g., to a higher or lower resistance state than "limited-range programmable cells").

In one embodiment, the MRAM array 414 does not have an external interface (e.g., is not accessible to a storage client, a host device, or the like) and/or is used exclusively for storing error-tracking data, such as error-tracking tables, ECC data, or the like. In a further embodiment, the MRAM array 414 and the PCM array 412 may both be independently accessible to storage clients, host devices, or the like (e.g., using a block device interface, a volatile memory semantic interface, or the like). As may be appreciated, the MRAM layer 408 may be formed in any suitable manner, such as by using one or more layers of deposition and/or one or more masks.

Figure 5:
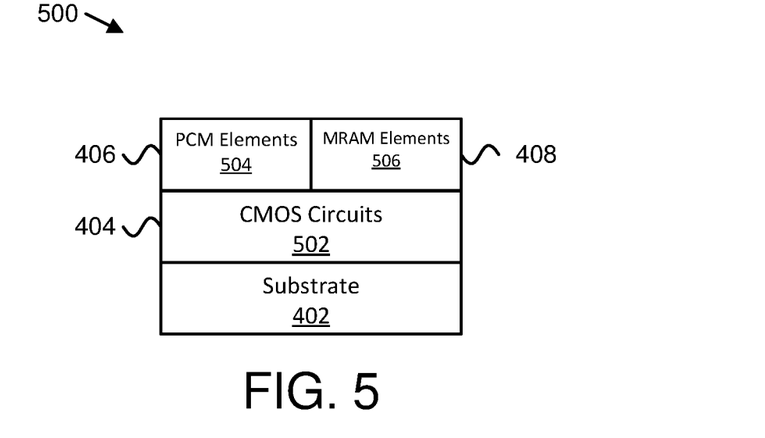
FIG. 5 is a schematic block diagram illustrating another embodiment of a chip having PCM and MRAM.

FIG. 5 is a schematic block diagram illustrating another embodiment of a chip 500 having PCM and MRAM, such as the hybrid die 150 of FIG. 2. The chip 500 includes the substrate 402, the CMOS layer 404 formed over the substrate 402, the PCM layer 406 formed over the CMOS layer 404, and the MRAM layer 408 formed over the CMOS layer 404. The substrate 402, the CMOS layer 404, the PCM layer 406, and the MRAM layer 408 may be similar to corresponding layers described in relation to FIG. 4.

In some embodiments, the CMOS layer 404 may be formed directly over the substrate 402. The CMOS layer 404 may include multiple CMOS circuits 502. In various embodiments, the PCM layer 406 may be formed directly over the CMOS layer 404. In the illustrated embodiment, the PCM layer 406 is formed before (e.g., prior to forming) the MRAM layer 408. In certain embodiments, the PCM layer 406 may be formed before the MRAM layer 408 at least in part because the PCM layer 406 is formed at a higher temperature than the MRAM layer 408. The PCM layer 406 may include multiple PCM elements 504 used to store data. The PCM elements 504 may be electrically coupled to the CMOS circuits 502 to enable the CMOS circuits 502 to control the PCM elements 504. In some embodiments, the PCM elements 504 may use an electrical resistive property for storing data.

In certain embodiments, the MRAM layer 408 may be formed directly over the CMOS layer 404. In the illustrated embodiment, the MRAM layer 408 is formed at approximately the same vertical distance from the substrate 402 as the PCM layer 406. Furthermore, the MRAM layer 408 is formed directly over a different portion of the CMOS layer 404 than the PCM layer 406. Moreover, the MRAM layer 408 is formed over a different portion of the substrate 402 than the PCM layer 406. In various embodiments, the MRAM layer 408 may be formed by the same equipment used to form the PCM layer 406. The MRAM layer 408 may include multiple MRAM elements 506 used to store data. The MRAM elements 506 may be electrically coupled to the CMOS circuits 502 to enable the CMOS circuits 502 to control the MRAM elements 506. In some embodiments, the MRAM elements may use a magnetoresistive property for storing data. In certain embodiments, the MRAM elements 506 may operate at a higher speed than the PCM elements 504. In such embodiments, the MRAM elements 506 may buffer data that the PCM elements 504 store. For example, the MRAM elements 506 may operate as a read buffer and/or a write buffer for the PCM elements 504. In one embodiment, the MRAM elements 506 may store error tracking data associated with data stored in the PCM elements 504. In certain embodiments, the MRAM elements 506 may store error correcting data used to correct errors in data stored in the PCM elements 504.

Figure 6:
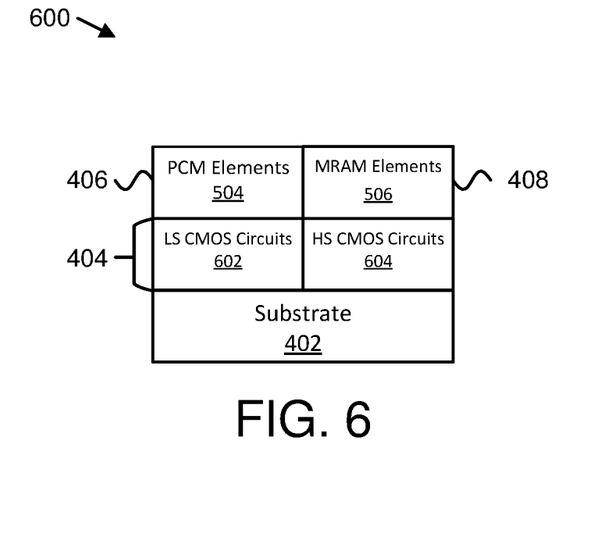
FIG. 6 is a schematic block diagram illustrating a further embodiment of a chip having PCM and MRAM.

FIG. 6 is a schematic block diagram illustrating a further embodiment of a chip 600 having PCM and MRAM, such as the hybrid die 150 of FIG. 2. The chip 600 includes the substrate 402, the CMOS layer 404 formed over the substrate 402, the PCM layer 406 formed over the CMOS layer 404, and the MRAM layer 408 formed over the CMOS layer 404. The substrate 402, the CMOS layer 404, the PCM layer 406, and the MRAM layer 408 may be similar to corresponding layers described in relation to FIG. 4.

In some embodiments, the CMOS layer 404 may be formed directly over the substrate 402. The CMOS layer 404 may include low speed (LS) CMOS circuits 602 and high speed (HS) CMOS circuits 604. In such embodiments, the HS CMOS circuits 604 may be used for performing operations at a higher speed than the LS CMOS circuits 602. In certain embodiments, the HS CMOS circuits 604 may include high frequency transistors and/or the LS CMOS circuits 602 may include low frequency transistors. In various embodiments, the HS CMOS circuits 604 may include high speed control circuits and/or the LS CMOS circuits 602 may include low speed control circuits. In such embodiments, the high speed control circuits may operate at a higher frequency than the low speed control circuits.

In various embodiments, the PCM layer 406 may be formed directly over the CMOS layer 404. In the illustrated embodiment, the PCM layer 406 is formed before (e.g., prior to forming) the MRAM layer 408. In certain embodiments, the PCM layer 406 may be formed before the MRAM layer 408 at least in part because the PCM layer 406 is formed at a higher temperature than the MRAM layer 408. The PCM layer 406 may include multiple PCM elements 504 used to store data. The PCM elements 504 may be electrically coupled to the LS CMOS circuits 602 to enable the LS CMOS circuits 602 to control the PCM elements 504. In some embodiments, the PCM elements 504 may use an electrical resistive property for storing data.

In certain embodiments, the MRAM layer 408 may be formed directly over the CMOS layer 404. In the illustrated embodiment, the MRAM layer 408 is formed at approximately the same vertical distance from the substrate 402 as the PCM layer 406. Furthermore, the MRAM layer 408 is formed directly over the HS CMOS circuits 604 while the PCM layer 406 is formed directly over the LS CMOS circuits 602. Moreover, the MRAM layer 408 is formed over a different portion of the substrate 402 than the PCM layer 406. In various embodiments, the MRAM layer 408 may be formed by the same equipment used to form the PCM layer 406. The MRAM layer 408 may include multiple MRAM elements 506 used to store data. The MRAM elements 506 may be electrically coupled to the HS CMOS circuits 604 to enable the HS CMOS circuits 604 to control the MRAM elements 506. In some embodiments, the MRAM elements may use a magnetoresistive property for storing data.

In certain embodiments, the MRAM elements 506 may operate at a higher speed than the PCM elements 504. In such embodiments, the MRAM elements 506 may buffer data that the PCM elements 504 store. For example, the MRAM elements 506 may operate as a read buffer and/or a write buffer for the PCM elements 504. In one embodiment, the MRAM elements 506 may store error tracking data associated with data stored in the PCM elements 504. In certain embodiments, the MRAM elements 506 may store error correcting data used to correct errors in data stored in the PCM elements 504.

Figure 7:
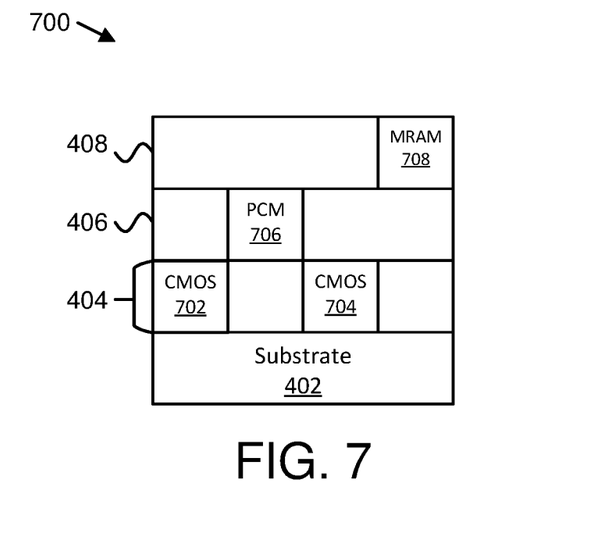
FIG. 7 is a schematic block diagram illustrating yet another embodiment of a chip having PCM and MRAM.

FIG. 7 is a schematic block diagram illustrating yet another embodiment of a chip 700 having PCM and MRAM, such as the hybrid die 150 of FIG. 2. The chip 700 includes the substrate 402, the CMOS layer 404 formed over the substrate 402, the PCM layer 406 formed over the CMOS layer 404, and the MRAM layer 408 formed over the PCM layer 406. The substrate 402, the CMOS layer 404, the PCM layer 406, and the MRAM layer 408 may be similar to corresponding layers described in relation to FIG. 4.

In some embodiments, the CMOS layer 404 may be formed directly over the substrate 402. The CMOS layer 404 may include CMOS circuits 702 and CMOS circuits 704. In certain embodiments, the CMOS circuits 704 may be used for performing operations at a higher speed than the CMOS circuits 702. In other embodiments, the CMOS circuits 702 and 704 may perform operations at approximately the same speed. In certain embodiments, the CMOS circuits 704 may include high frequency transistors and/or the CMOS circuits 702 may include low frequency transistors. In other embodiments, the CMOS circuits 702 and 704 may have substantially the same transistors. In various embodiments, the CMOS circuits 702 and 704 may facilitate accessing the PCM layer 406 and the MRAM layer 408 in parallel (e.g., at the same time).

In various embodiments, the PCM layer 406 may be formed directly over the CMOS layer 404. In the illustrated embodiment, the PCM layer 406 is formed before (e.g., prior to forming) the MRAM layer 408. In certain embodiments, the PCM layer 406 may be formed before the MRAM layer 408 at least in part because the PCM layer 406 is formed at a higher temperature than the MRAM layer 408. The PCM layer 406 may include a PCM array 706 used to store data. The PCM elements of the PCM array 706 may be electrically coupled to the CMOS circuits 702 to enable the CMOS circuits 702 to control the PCM elements. In some embodiments, the PCM elements may use an electrical resistive property for storing data.

In certain embodiments, the MRAM layer 408 may be formed directly over the PCM layer 406. In the illustrated embodiment, the MRAM layer 408 is formed at a different vertical distance from the substrate 402 as the PCM layer 406. Furthermore, the MRAM array 708 is formed over the CMOS circuits 704, but offset horizontally from the CMOS circuits 704. In addition, the PCM array 706 is formed over the CMOS circuits 702, but offset horizontally from the CMOS circuits 702. Moreover, the MRAM array 708 is formed over a different portion of the substrate 402 than the PCM array 706. In various embodiments, the MRAM array 708 may be formed by the same equipment used to form the PCM array 706. The MRAM array 708 may include multiple MRAM elements used to store data. The MRAM elements may be electrically coupled to the CMOS circuits 704 to enable the CMOS circuits 704 to control the MRAM elements. In some embodiments, the MRAM elements may use a magnetoresistive property for storing data. In certain embodiments, the MRAM elements may buffer data that the PCM elements store. For example, the MRAM elements may operate as a read buffer and/or a write buffer for the PCM elements. In one embodiment, the MRAM elements may store error tracking data associated with data stored in the PCM elements. In certain embodiments, the MRAM elements may store error correcting data used to correct errors in data stored in the PCM elements.

Figure 8:
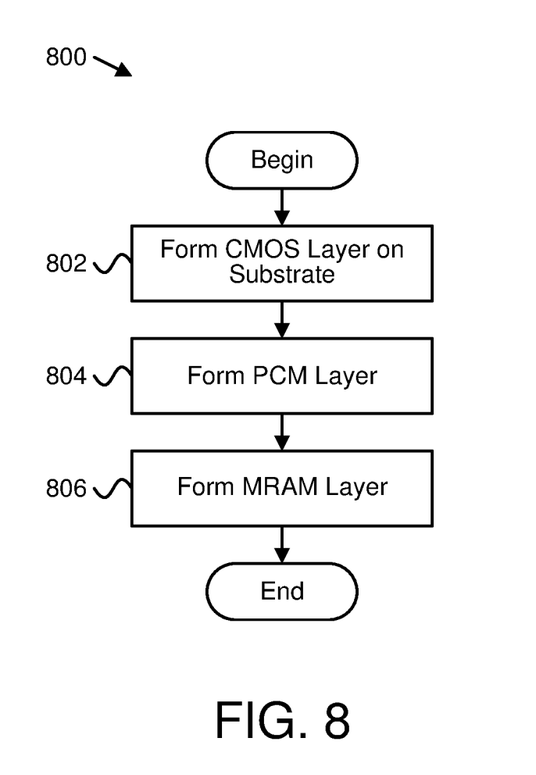
FIG. 8 is a schematic flow chart diagram illustrating one embodiment of a method for making a chip having PCM and MRAM.

FIG. 8 is a schematic flow chart diagram illustrating one embodiment of a method 800 for making a chip having PCM and MRAM. The method 800 begins, and a manufacturer forms 802 a CMOS layer 404 on a substrate 402. In various embodiments, a CMOS layer 404 includes multiple CMOS circuits. The manufacturer forms 804 a PCM layer 408 above a CMOS layer 404. In some embodiments, a PCM layer 408 includes multiple PCM elements. In one embodiment, a first set of CMOS circuits of multiple CMOS circuits is electrically coupled to multiple PCM elements. The manufacturer forms 806 an MRAM layer 412 above a PCM layer 408, and the method 800 ends. In a certain embodiment, an MRAM layer 412 includes multiple MRAM elements, and a second set of CMOS circuits of multiple CMOS circuits is electrically coupled to the multiple MRAM elements.

A means for controlling operation of a memory device (e.g., PCM array 200, MRAM array 206), in various embodiments, may include control circuits 212, CMOS 214, high speed CMOS 216, a CMOS layer 404, CMOS circuits 410, LS CMOS circuits 602, HS CMOS circuits 604, an on-die controller, a state machine, or the like. In certain embodiments, the means for controlling operation of the memory device may be formed on a substrate 402 of the memory device. Other embodiments may include similar or equivalent means for controlling operation of a memory device.

A means for storing data using a magnetoresistive property within a memory device, in various embodiments, may include an MRAM array 206, an MRAM layer 408, MRAM elements 506, one or more MRAM cells, a non-volatile memory medium, one or more non-volatile memory cells, or the like. Other embodiments may include similar or equivalent means for storing data using a magnetoresistive property within the memory device.

A means for storing data using an electrical resistive property within the memory device, in various embodiments, may include a PCM array 200, a PCM layer 406, PCM elements 504, one or more PCM cells, a non-volatile memory medium, one or more non-volatile memory cells, or the like. Other embodiments may include similar or equivalent means for storing data using an electrical resistive property within the memory device. In some embodiments, a means for storing data using the electrical resistive property is disposed in a layer between a means for storing data using the magnetoresistive property and a means for controlling operation of a memory device formed on a substrate.

A means for correcting errors in data stored using an electrical resistive property based on data stored using a magnetoresistive property, in various embodiments, may include an MRAM array 206, an MRAM layer 408, MRAM elements 506, an error correcting code (ECC) decoder, a device controller, an on-die controller, or the like. Other embodiments may include similar or equivalent means for correcting errors in data stored using an electrical resistive property based on data stored using a magnetoresistive property.

A means for controlling operation of a memory device, in certain embodiments, comprises a high speed control circuit (e.g., HS CMOS circuits 604) for a means for storing data using a magnetoresistive property and comprises a low speed control circuit (e.g., LS CMOS circuits 602) for a means for storing data using an electrical resistive property (e.g., the high speed control circuit operating at a higher frequency than the low speed control circuit). Other embodiments may include similar or equivalent means.

In various embodiments, a means for storing data using a magnetoresistive property and a means for storing data using an electrical resistive property may be electrically coupled to a means for controlling operation of a memory device. It should be noted that while PCM is described herein, other embodiments may substitute resistive random-access memory (ReRAM) for PCM.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a semiconductor logic circuit formed over a substrate of a chip;
   a phase change memory (PCM) array formed over the semiconductor logic circuit and electrically coupled to the semiconductor logic circuit; and
   a magnetoresistive random access memory (MRAM) array formed over the semiconductor logic circuit and storing data independently and separately from the PCM array, the MRAM array also being electrically coupled to the semiconductor logic circuit.

2. The apparatus of claim 1, wherein the PCM array is formed directly over a different portion of the semiconductor logic circuit than the MRAM array.

3. The apparatus of claim 1, wherein the PCM array is formed at a different vertical distance from the substrate than the MRAM array.

4. The apparatus of claim 1, wherein the PCM array is formed at a higher temperature than the MRAM array.

5. The apparatus of claim 1, wherein the PCM array is formed prior to forming the MRAM array.

6. The apparatus of claim 1, wherein the MRAM array buffers data the PCM array stores.

7. The apparatus of claim 6, wherein the MRAM array operates at a higher speed than the PCM array.

8. The apparatus of claim 1, wherein the MRAM array stores error tracking data associated with data stored in the PCM array.

9. The apparatus of claim 1, wherein the semiconductor logic circuit comprises one or more of a complementary metal oxide semiconductor (CMOS) circuit and an n-type metal oxide semiconductor (NMOS) circuit.

10. A method comprising:
    forming a complementary metal oxide semiconductor (CMOS) layer on a substrate, wherein the CMOS layer comprises a plurality of CMOS circuits;
    forming a phase change memory (PCM) layer above the CMOS layer, wherein the PCM layer comprises a plurality of PCM elements, and wherein a first set of CMOS circuits of the plurality of CMOS circuits is electrically coupled to the plurality of PCM elements; and
    forming a magnetoresistive random access memory (MRAM) layer above the PCM layer, wherein the MRAM layer comprises a plurality of MRAM elements, and a second set of CMOS circuits of the plurality of CMOS circuits is electrically coupled to the plurality of MRAM elements, the plurality of MRAM elements store data independently and separately from the plurality of PCM elements, and the plurality of CMOS circuits are electrically coupled between the plurality of MRAM elements and the plurality of PCM elements.

11. The method of claim 10, wherein the first set of CMOS circuits and the second set of CMOS circuits both comprise a same type of transistors.

12. The method of claim 10, wherein the second set of CMOS circuits comprises higher frequency transistors than the first set of CMOS circuits.

13. The method of claim 10, wherein the plurality of MRAM elements track errors for the plurality of PCM elements.

14. The method of claim 10, wherein the PCM layer is manufactured at a higher temperature than the MRAM layer.

15. The method of claim 10, wherein the PCM layer and the MRAM layer are formed by the same equipment.

16. The method of claim 10, wherein the plurality of PCM elements is formed directly above the first set of CMOS circuits.

17. An apparatus comprising:
    means for controlling operation of a memory device, the means for controlling operation formed on a substrate of the memory device;
    means for storing data using a magnetoresistive property within the memory device, wherein the means for storing data using the magnetoresistive property is electrically coupled to the means for controlling operation of the memory device; and
    means for storing data using an electrical resistive property within the memory device, the means for storing data using the electrical resistive property disposed in a layer between the means for storing data using the magnetoresistive property and the means for controlling operation of the memory device formed on the substrate, wherein the means for storing data using the magnetoresistive property stores data independently and separately from the means for storing data using the electrical resistive property and the means for storing data using the electrical resistive property is electrically coupled to the means for controlling operation of the memory device.

18. The apparatus of claim 17, further comprising means for correcting errors in the data stored using the electrical resistive property based on the data stored using the magnetoresistive property.

19. The apparatus of claim 17, wherein the means for controlling operation of the memory device comprises a high speed control circuit for the means for storing data using the magnetoresistive property and a low speed control circuit for the means for storing data using the electrical resistive property, the high speed control circuit operating at a higher frequency than the low speed control circuit.

20. The apparatus of claim 1, wherein the semiconductor logic circuit is electrically coupled between the PCM array and the MRAM array electrically.

\* \* \* \* \*